United States Patent [19]
Ko et al.

[11] Patent Number: 6,124,216
[45] Date of Patent: Sep. 26, 2000

[54] METHOD OF MAKING INTERMETAL DIELECTRIC LAYERS HAVING A LOW DIELECTRIC CONSTANT

[75] Inventors: Ho Ko; Tae-Ryong Kim; Chung-Howan Kim; Dong-Yun Kim; Jong-Heui Song, all of Suwon, Rep. of Korea

[73] Assignee: Samsung Electronics Co., Ltd., Suwon, Rep. of Korea

[21] Appl. No.: 09/393,185

[22] Filed: Sep. 10, 1999

[30] Foreign Application Priority Data

Feb. 12, 1999 [KR] Rep. of Korea ......................... 99-5109

[51] Int. Cl.$^7$ .............................. H01L 23/48; H01L 29/52
[52] U.S. Cl. ........................... 438/766; 438/761; 438/786; 438/787; 438/788
[58] Field of Search ..................................... 438/786, 787, 438/788, 761, 766

[56] References Cited

U.S. PATENT DOCUMENTS

| | | |
|---|---|---|
| 4,756,977 | 7/1988 | Haluska et al. . |
| 5,320,868 | 6/1994 | balance et al. ........................... 427/228 |
| 5,703,404 | 12/1997 | Matsuura ................................ 257/758 |
| 5,719,084 | 2/1998 | Mallon et al. . |
| 5,776,834 | 7/1998 | Avanzino et al. . |
| 5,818,111 | 10/1998 | Jeng et al. ............................... 257/776 |
| 5,837,618 | 11/1998 | Avanzino et al. . |

OTHER PUBLICATIONS

M. Matsuura et all, "A Highly Reliable Self–planarizing Low–k Intermetal Dielectric for Sub–quarter Micron Interconnects," 1997 IEEE, IEDM 97–785 through 97–788.

N. Oda et al., "O.6 um Pitch Highly Reliable Multilevel Interconnection Using Hydrogen Silicate Based Inorganic SOG for Sub–Quarter Micron CMOS Technology," 1997 Symposium on VLSI Technology Digest of Technical papers, pp. 79–80.

B. Zhao et al, "A Cu/Low–k Dual Damascene Interconnect for High Performance and Low Cost integrated Circuits," 1998 Symposium on VLSI Technology Digest of Technical Papers, pp. 28–29.

R. S. List et al., "Integration of Ultra–Low–k Xerogel Gapfill Dielectric for High Performance Sub–0.18um Interconnects," 1997 Symposium on VLSI Technology Digest of Technical Papers, pp. 77–78.

K. Yoshiyama et al., "A Simple Sub–0.3um CMOS Technology with Five–Level Interconnect using Al–plug and HSQ of Low–k for High Performance Processor," 1997 Symposium on VLSI Technology Digest of Technical Papers, pp. 55–56.

*Primary Examiner*—Charles Bowers
*Assistant Examiner*—Lisa Kilday
*Attorney, Agent, or Firm*—Jones Volentine, L.L.C.

[57] ABSTRACT

A method of forming a low-k dielectric insulating layer includes forming the dielectric insulating layer and then removing hydrogen bonds in the dielectric insulating layer. The dielectric layer as formed is preferably a HSQ film which contains the structure Si—O—H. Hydrogen is removed from the dielectric layer by either: a heat treatment in plasma, an ozone reduction process, an ion implantation process, or electron beam bombardment.

22 Claims, 8 Drawing Sheets

METHOD OF MAKING INTERMETAL DIELECTRIC LAYERS HAVING A LOW DIELECTRIC CONSTANT

FIELD OF THE INVENTION

The present invention relates generally to methods for forming insulation layers for semiconductor devices, and more particularly, to methods for forming an intermetal dielectric layer that has a low dielectric constant and a reduced occurrence of voids.

BACKGROUND OF THE INVENTION

The sizes of the discrete components that make up semiconductor devices have consistently been scaled down for more than 20 years. The benefits obtained by shrinking component size include enhanced device performance and high clock frequencies.

As semiconductor devices are scaled down in size, the width and spacing of interconnects connecting the components of the devices are also scaled down. Smaller and smaller interconnect dimensions lead to a number of problems. For example, closer spacing between conductive lines results in a rise in parasitic capacitance between multiple semiconductor layers and within a single layer. An increasing parasitic capacitance increases the RC (resistance-capacitive) delay associated with the device, which limits the length of global routing lines and tends to slow down the device. Further, as the pitches of lines in the device are reduced, undesirable cross-talk between the lines increases.

A semiconductor layer known as an interlayer dielectric (ILD) layer is a layer formed between multiple active layers of a semiconductor device. One known approach to reducing RC delay and cross-talk effects between multiple semiconductor layers involves decreasing the dielectric constant (k) of the ILD layer. Conventional attempts at reducing the dielectric constant of the ILD typically form the ILD layer from a polymer, such as, hydrogen silsesquioxane (HSQ), parylene, polyimide, or amorphous Teflon.

In an article by K. Yoshiyama et al., "A Simple Sub-0.3 $\mu$m CMOS Technology with Five-Level Interconnect using Al-plug and HSQ of Low-k for High Performance Processor", 1997 Symposium on VLSI Technology Digest of Technical Papers, pp. 55–56, there is disclosed a sub-0.3 micron CMOS technology that has a five-level interconnect structure which uses aluminum plugs and a low dielectric constant HSQ film. The interlayer dielectric film of the Yoshiyama device comprises a thin plasma TEOS (tetraethylorthosilicate) film and an HSQ film formed on the TEOS film by a spin-on method. The gap-filling properties of the HSQ film and the consequent reduction of parasitic coupling capacitance in the Yoshiyama device was reported as excellent. More particularly, the parasitic coupling capacitance was reduced by more than 10% compared to conventional devices.

Additional descriptions of the formation of low dielectric (low-k) ILD layers can be found in U.S. Pat. No. 4,756,977 to Haluska et al. and U.S. Pat. No. 5,320,868 to Ballance et al. More particularly, Haluska et al. describe a method for forming a low-k dielectric film by diluting in a solvent a HSQ resin solvent solution, which is applied to a substrate and transformed into a ceramic by heating.

The above-discussed conventional methods for forming a low-k dielectric film generally produce a predominantly Si—O—H dielectric film structure. The hydrogen (—H) in the Si—O—H structure of such a low-k dielectric film has been found to be very reactive with gases such as $CHF_3$ and $CF_5$ used in subsequent dry etching steps for forming a contact via in the dielectric layer. Consequently, the etching profile of an HSQ film with a low-k dielectric tends to exhibit a bowing effect.

FIG. 1 is a cross-section of an ILD layer formed with conventional techniques. Layers 105 and 107 are dielectric layers having a dielectric constant different from that of the ILD layer 106. The bowing effect 110 in the etching profile of the low-k oxide ILD layer 106 can result in a void 112 being created when a metal plug 111 is formed so as to electrically interconnect the upper conductive layer 108 and the lower conductive layer 109. The void 112 deteriorates the electrical conductivity of the interconnections. Furthermore, the reaction of hydrogen in the ILD layer with gases during the dry etching process can generate defects on the surface of the dielectric film.

SUMMARY OF THE INVENTION

Accordingly, it is an object of the present invention to form a low-k dielectric film as an interlayer dielectric (ILD) insulator between the conductive layers, with the low-k dielectric film exhibiting an improved etching profile during subsequent dry etching steps.

It is also an object of the present invention to provide a method for forming a low-k interlayer dielectric film with a void-free contact via on a semiconductor substrate.

A further object of the present invention is to provide a method for forming a low-k dielectric film having a surface substantially free from defects even after the dielectric film is exposed to the reacting gases during a dry etching step.

One method consistent with the present invention for forming a dielectric film on a semiconductor substrate comprises forming a dielectric layer on the substrate, with the dielectric layer including hydrogen that is bonded with other elements. Thereafter, the dielectric layer is treated in plasma at a temperature of about 50 to 1000 degrees Centigrade and at a pressure of about 50 to 1000 mTorr, in the presence of an RF source having a frequency in the range of about 400 Hz to 3 GHz and an output power of about 500 to 2000 Watts.

A second method consistent with the present invention for forming a dielectric film on a semiconductor substrate includes forming a dielectric layer on the substrate, with the dielectric layer including hydrogen that is bonded with other elements, and then heat treating the dielectric layer in an ozone ambient at a temperature of about 100 to 1000 degrees Centigrade to remove the hydrogen from the dielectric layer.

Other methods consistent with the present invention are similar to the above discussed method in that they form a dielectric layer containing hydrogen on the substrate. However, in these methods, the hydrogen may alternatively be removed by electron beam bombardment or ion implantation.

BRIEF DESCRIPTION OF THE DRAWINGS

The accompanying drawings, which are incorporated in and constitute a part of this specification, illustrate several embodiments consistent with this invention and, together with the description, help explain the principles of the invention. In the drawings.

DETAILED DESCRIPTION OF THE PREFERRED EMBODIMENT OF THE INVENTION

Reference will now be made in detail to embodiments of the invention, examples of which are illustrated in the accompanying drawings. Wherever possible, the same reference numbers will be used throughout the drawings to refer to the same or like parts.

As described herein, the hydrogen (—H) in the Si—O—H structure of a low-k dielectric film is removed prior to etching contact vias in the dielectric film. This tends to improve the resultant structure of the semiconductor devices by improving the vertical structure of the contact vias and reducing the formation of voids in the vias. Additionally, fewer defects tend to occur on the surface of the dielectric film.

Figure 2:
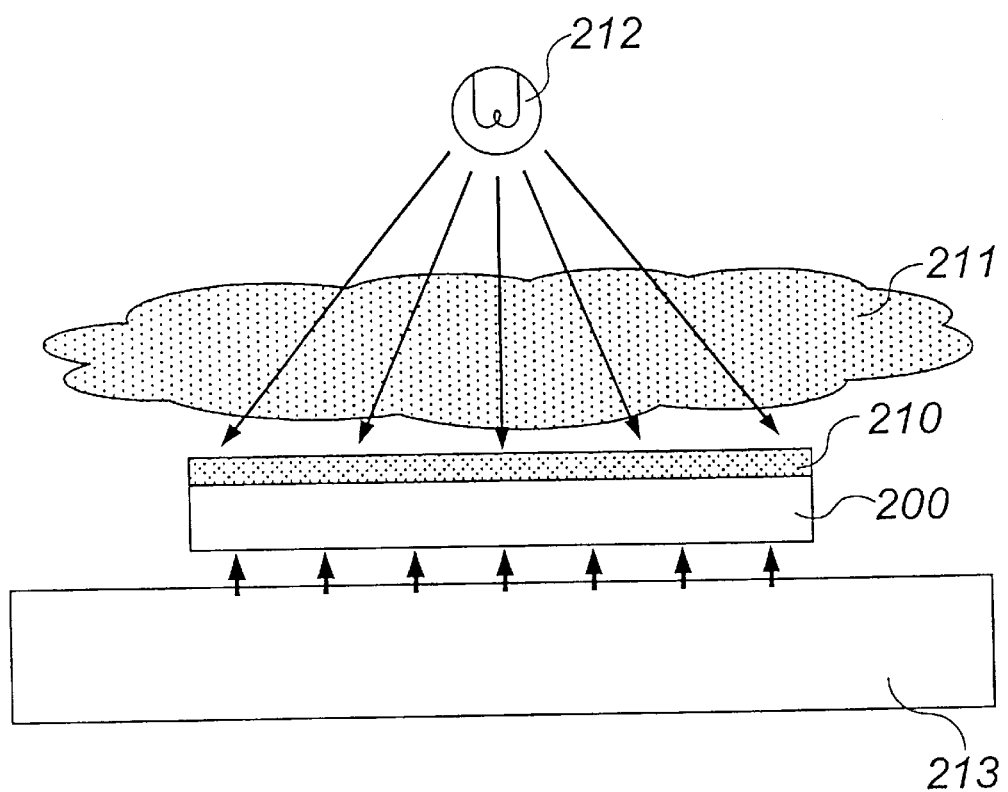
FIG. 2 is a schematic diagram illustrating plasma heat treatment in accordance with a first embodiment of the present invention.

In a first embodiment consistent with the present invention, heat treatment is used to cure a low-k dielectric film. FIG. 2 is a schematic diagram illustrating heat treatment of a low-k dielectric film according to the first embodiment.

A low-k dielectric film 210 is formed on a semiconductor substrate 200. Heat used to cure film 210 may be generated by lamp 212 or by heating plate 213. The dielectric film 210 is heated in the presence of plasma 211, which is generated by subjecting a gas selected from the group of gases $O_2$, $N_2$, $H_2N_2$, and $NH_3$, or combination thereof, to a radio frequency power source.

Dielectric film 210 is preferably formed from an inorganic source of silicon oxide, such as hydrogen silsesquioxane (HSQ), and has the chemical structure Si—O—H. By heat treating dielectric film 210 in the presence of plasma, the film 210 tends to change to a chemically stable low-k dielectric having the chemical structure Si—O (silicon oxide). That is, the plasma heat treatment removes the hydrogen that is bonded to the dielectric film 210.

The above-described heat treatment in plasma is preferably performed at a temperature of about 50 to 1000 degrees Centigrade, at a pressure of about 50 to 1000 mTorr, and in the presence of an RF source having a frequency of about 400 Hz to 3 GHz and an output power of about 500 to 2000 Watts.

The hydrogen bonds in dielectric film 210 may be removed by methods other than plasma heat treatment.

For example, in a second embodiment consistent with the present invention, dielectric film 210, which has the structure Si—O—H, may be converted to a silicon oxide film with essentially no hydrogen bonds using an ozone reduction process. Ozone reduction involves heat treating the dielectric film 210 in the presence of ozone at a temperature of about 100 to 1000 degrees Centigrade. The heat treatment of the dielectric film 210 in ambient ozone reduces the HSQ film to a silicon oxide without —OH bonds.

In a third embodiment consistent with the present invention, dielectric film 210 having the structure Si—O—H may be converted to a silicon oxide film using an ion implantation process. The ion implantation process employs a source gas comprising one or more of $O_2$, $N_2$, $PH_3$, $BF_3$, $AsH_3$, and $BF_2$, supplied at a rate of about 1–100,000 sccm, an energy of about 1–100 KeV, and a dose of about $1.0 \times 10^{11}$ to $1.0 \times 10^{16}/cm^2$.

In a fourth embodiment consistent with the present invention, dielectric film 210 having the structure Si—O—H may be converted to a silicon oxide film using an electron-beam bombardment process. The electron-beam bombardment process employs a gas comprising $O_2$ or $N_2$, supplied at a rate of about 1–100,000 sccm, an energy of about 1–100 KeV, a temperature of about 100–2000 degrees Centigrade, and a pressure of about $1 \times 10^{-8}$ to $1 \times 10^{-3}$ Torr.

FIGS. 3A to 3F are schematic cross-sectional views illustrating steps in the manufacturing process of a semiconductor device made consistent with the concepts of the present invention, which can be employed in both DRAM (dynamic random access memory) and logic circuit formation processes.

Figure 3A:
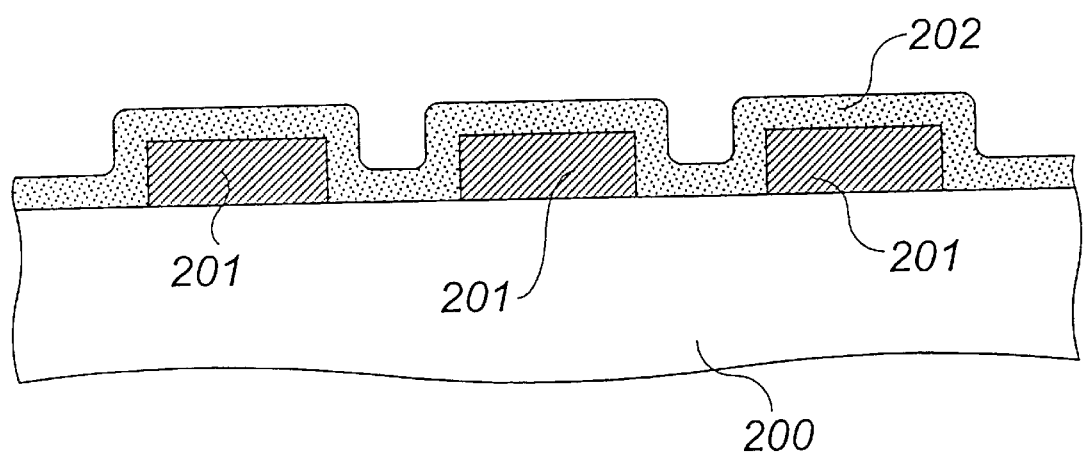
FIGS. 3A to 3F are schematic cross-sectional views illustrating various stages of a semiconductor process in accordance with an embodiment of the present invention.

Referring to FIG. 3A, a first conductive layer 201 is formed on a semiconductor substrate 200 and a first dielectric film 202 is formed over the first conductive layer 201. The first dielectric film 202 may be a layer of plasma tetraethylorthosilicate (TEOS).

Figure 3B:
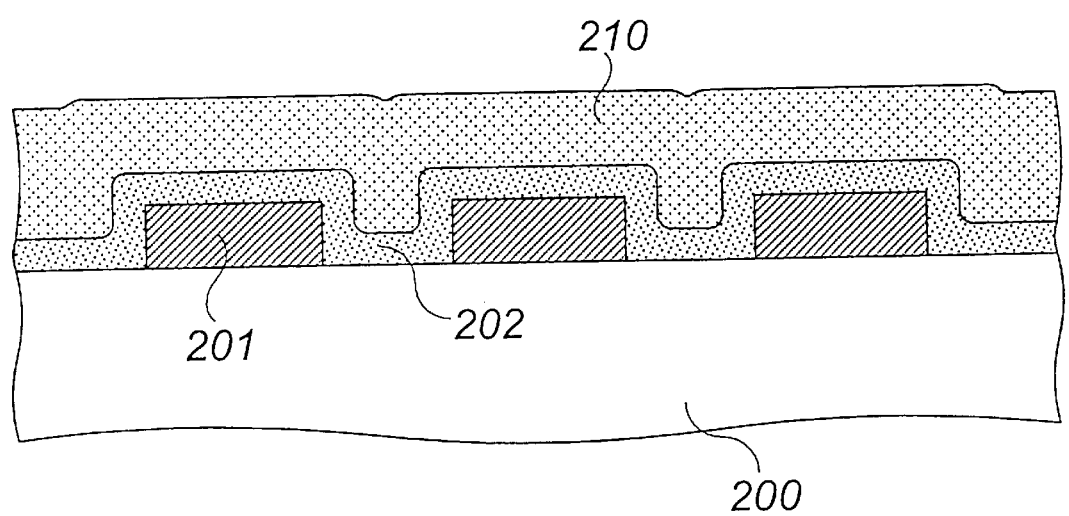

Referring to FIG. 3B, a second layer 210 of a low-k dielectric is formed on the first dielectric film 202. The low-k dielectric film layer 210 is a polymer containing the Si—O—H structure, such as hydrogen silsesquioxane (HSQ). Dielectric materials containing a Si—O—H structure typically have a lower dielectric constant than plasma TEOS oxide 202.

Dielectric film 210, which contains Si—O—H bonds, is subsequently converted to a silicon oxide with essentially no hydrogen bonds. The transformation is preferably achieved by baking the dielectric film 210 in ultraviolet (UV) light and curing the film 210 by heat treatment in plasma. Curing of film 210 is discussed above in the description of the first embodiment. The steps of UV-baking and curing dielectric film 210 may be repeated several times to ensure maximum elimination of hydrogen bonds from the dielectric film.

Alternatively, instead of curing the film 210 by heat treatment in plasma, hydrogen can be removed from the film 210 using methods consistent with the second through fourth embodiments of the present invention. Namely, the elimination of hydrogen bonds from the low-k dielectric film 210 may alternatively be accomplished by employing an ozone reduction process, an ion implantation process, or an electron beam bombardment process.

Figure 3C:
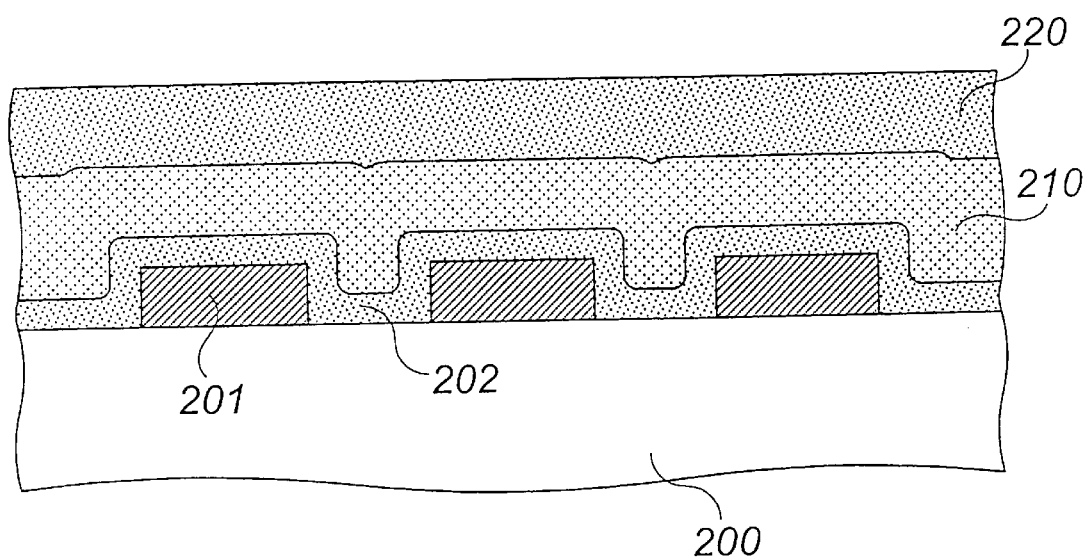
Figure 3D:
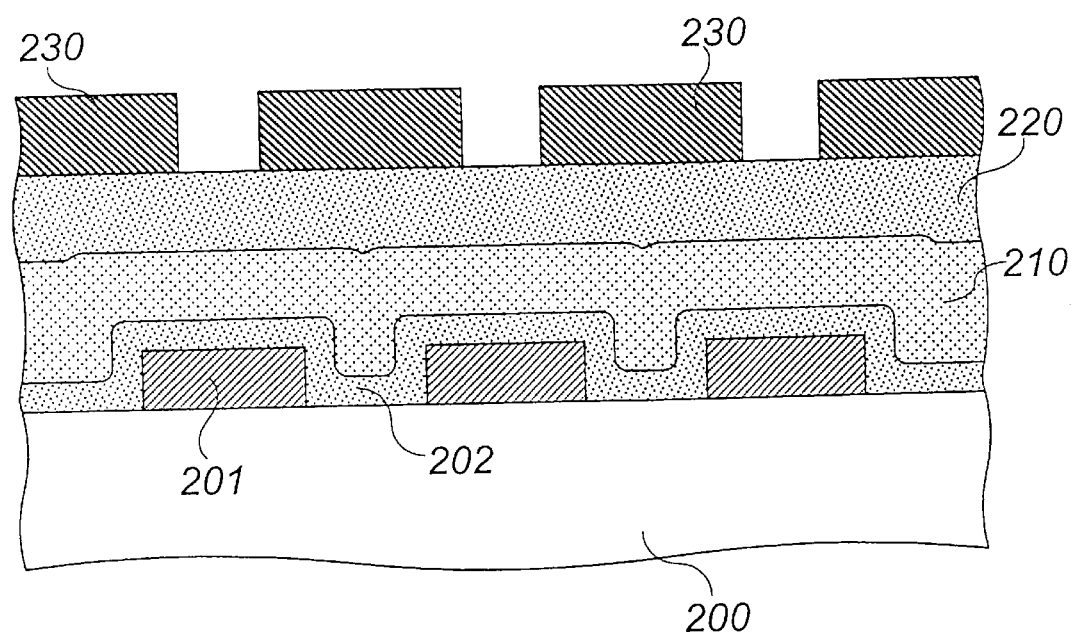

After the hydrogen has been removed from film 210, and as shown in FIG. 3C, a third layer 220 of a dielectric material is formed on the second low-k dielectric film 210. Third layer 220 may be a plasma TEOS oxide film. As shown in FIG. 3D, a photoresist pattern 230 is then formed on the third dielectric layer 220. Photoresist pattern 230 is used to etch contact holes (also called via holes) that interconnect the lower conductive layer 201 to the upper conductive layer (layer 251 is shown in FIG. 3F).

Figure 1:
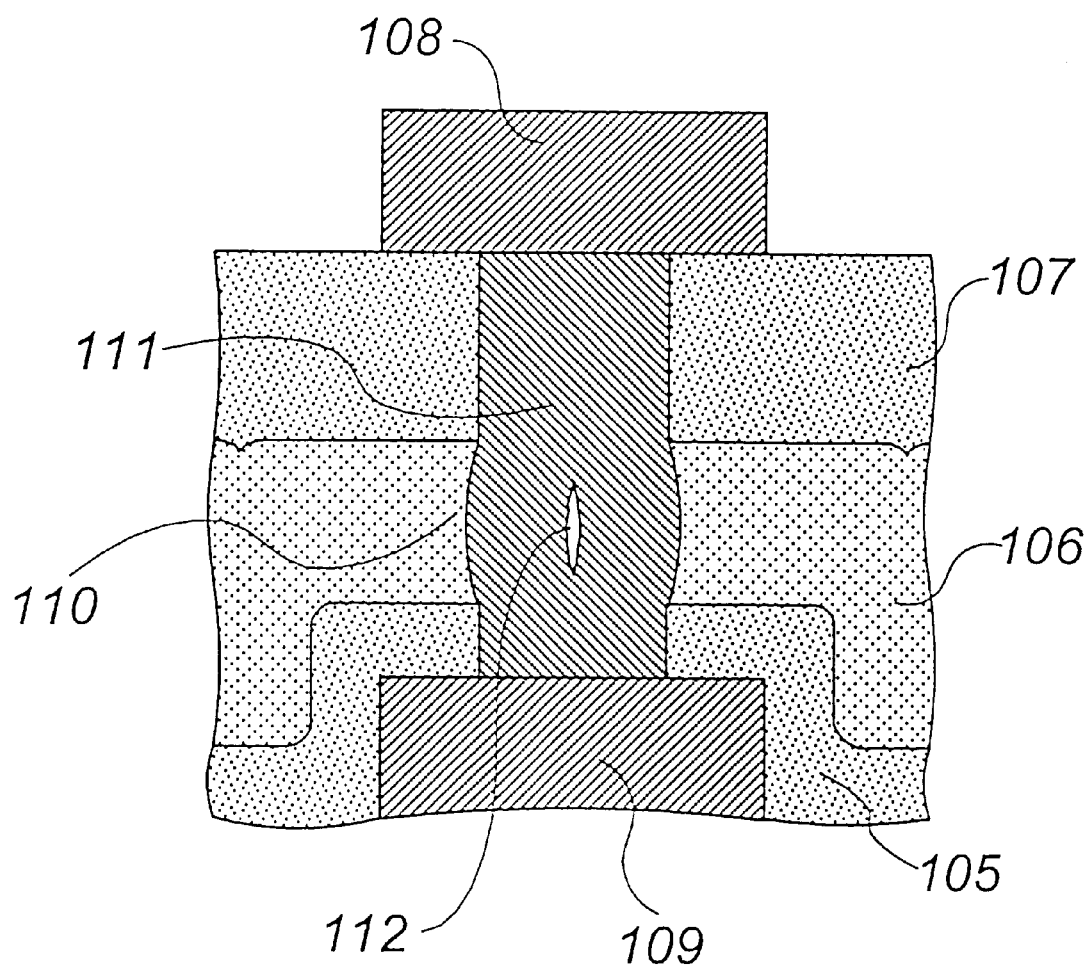
FIG. 1 is schematic cross-sectional view of a conventional interconnect layer having a void and a bowed etch profile.
Figure 3E:
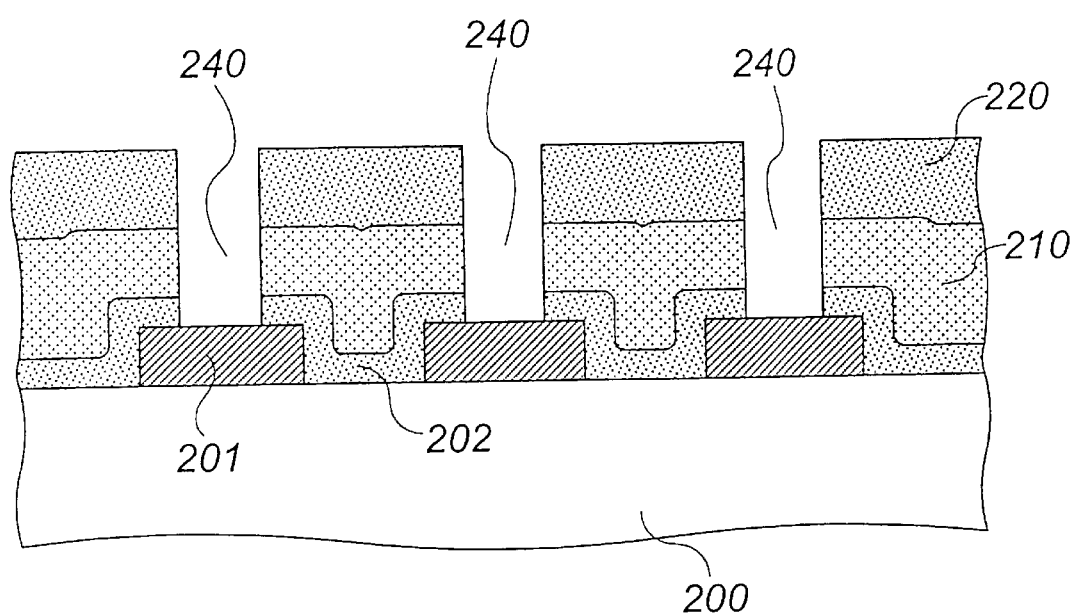

Referring to FIG. 3E, contact holes 240 having a vertical etch profile are formed by reactive ion etching (RIE) the first dielectric 202, the second dielectric 210, and the third dielectric 220. As shown in FIG. 3E, the etch profile of the second dielectric layer 210 is vertically straight and tends to not exhibit the undesirable bowing effect shown in FIG. 1.

This is because the low-k dielectric layer 210 with no hydrogen bonds in accordance with the present invention is not chemically reactive with the gases, such as $CF_4$ and $CHF_3$, used in the RIE etching process for forming the contact holes. Consequently, after the RIE process, the low-k dielectric layer 210 does not exhibit either a bowed etch profile nor the surface defects on the layer due to a chemical reaction.

Figure 3F:
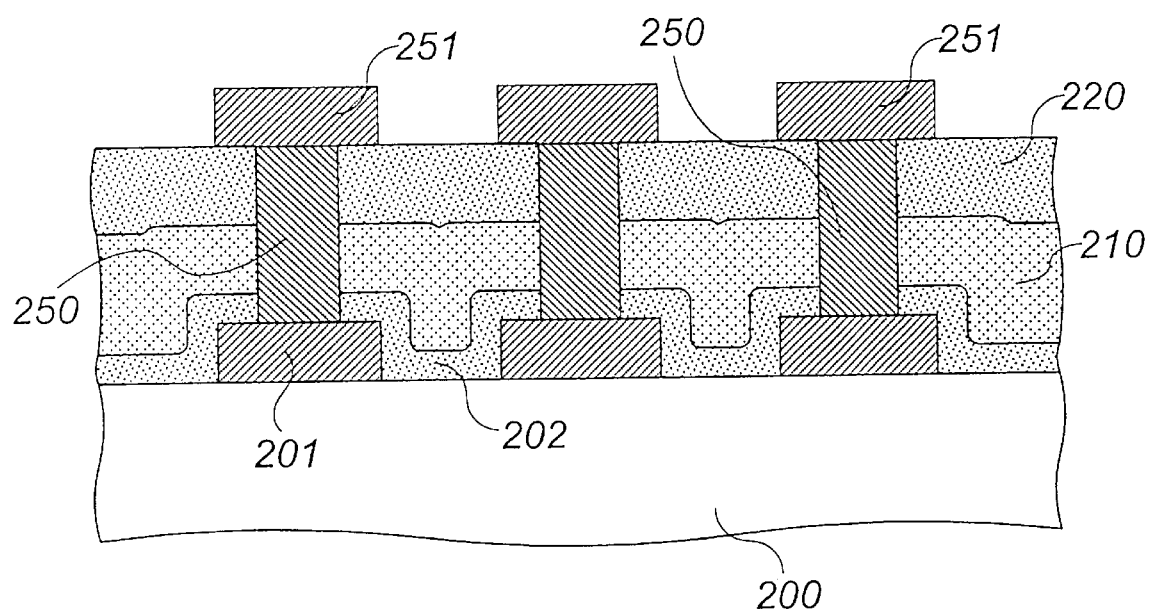

Referring to FIG. 3F, a metal plug 250 is formed in the contact holes 250 to electrically interconnect the upper conductive layer 251 and the lower conductive layer 201. Since the etch profile of the contact hole through the dielectric films 202, 210, 220 is vertically straight, voids, such as void 112 (FIG. 1) do not form.

The above described methods and devices improve the formation of contact vias through interlayer dielectric films in a semiconductor device. These concepts are particularly applicable in manufacturing DRAMs, although they may also be used in the manufacture of other semiconductor devices. Although the invention has been illustrated and described with respect to exemplary embodiments thereof, it should be understood by those skilled in the art that various other changes, omissions and additions may be made therein and thereto, without departing from the spirit and scope of the present invention.

Therefore, the present invention should not be understood as limited to the specific embodiments set forth above but to include all possible embodiments within the scope of the appended claims and equivalents thereof.

What is claimed:

1. A method of forming a dielectric film on a semiconductor substrate comprising:
    forming a dielectric layer on said substrate, the dielectric layer including hydrogen bonded with at least one other element; and
    after the dielectric layer is formed on the substrate, removing hydrogen from the dielectric layer by heat treating the dielectric layer with plasma under conditions which break the hydrogen bonds, said heat treating comprising exposing the dielectric layer to plasma having a temperature of about 50 to 1000 degrees Centigrade and at a pressure of about 50 to 1000 mTorr, and generated in the presence of an RF source having a frequency in the range of about 400 Hz to 3 GHz and an output power of about 500 to 2000 Watts.

2. The method of claim 1, wherein said forming of a dielectric layer comprises forming the dielectric layer of a material having a Si—O—H structure.

3. The method of claim 1, wherein said heat treating comprises generating the plasma from at least one gas selected form the group consisting of $O_2$, $N_2$, $H_2N_2$, and $NH_3$.

4. A method of forming a dielectric film on a semiconductor substrate comprising the steps of:
    forming a dielectric layer on said substrate, the dielectric layer including hydrogen bonded with at least one other element; and
    after the dielectric layer is formed on the substrate, removing hydrogen from the dielectric layer by heat treating the dielectric layer with an ozone ambient under conditions which break the hydrogen bonds, said heat treating comprising exposing the dielectric layer to ozone ambient having a temperature of about 100 to 1000 degrees Centigrade.

5. A method of forming a dielectric film on a semiconductor substrate comprising:
    forming a dielectric layer on said substrate, the dielectric layer including hydrogen bonded with at least one other element; and
    removing hydrogen from said dielectric layer by implanting a predetermined ion into said dielectric layer ions under conditions which break the hydrogen bonds.

6. A method of forming a dielectric film on a semiconductor substrate comprising:
    forming a dielectric layer on said substrate, the dielectric layer including hydrogen bonded with at least one other element; and
    removing hydrogen from said dielectric layer by bombarding the dielectric layer with an electron beam under conditions which break the hydrogen bonds.

7. A method of forming intermetal dielectric layers, comprising the steps of:
    providing a substrate on which a conductive layer is disposed;
    forming a first dielectric film on said conductive layer;
    forming a low-k second dielectric film on the first dielectric film, the second dielectric film containing hydrogen bonded to at least one other element;
    after the second dielectric film is formed, removing hydrogen from said second dielectric film by treating said second dielectric film in situ;
    forming a third dielectric film on said second dielectric film;
    etching a contact hole through the dielectric films to expose the conductive layer using an etchant which is highly reactive with hydrogen, whereby the removal of the hydrogen from the low-k second dielectric film inhibits a phenomena of bowing from occurring in a profile of the etched portion of the second dielectric film; and
    filling the contact hole with a conductive material.

8. The method of claim 7, wherein said forming of the first dielectric film comprises forming a silicon oxide film on said conductive layer.

9. The method of claim 7, wherein said forming of the third dielectric film comprises forming a silicon oxide film on the second dielectric film.

10. The method of claim 7, wherein said forming of the second dielectric film comprises forming a dielectric film containing a Si—O—H structure on the first dielectric film.

11. The method of claim 10, wherein said removing of hydrogen transforms said second dielectric film into a dielectric film having a Si—O structure.

12. The method of claim 7, wherein said removing of hydrogen comprises generating plasma from at least one gas selected from the group consisting of $O_2$, $N_2$, $H_2N_2$, and $NH_3$, and heat-treating the second dielectric film with the plasma.

13. The method of claim 7, wherein said removing of hydrogen comprises performing a chemical reduction process in an ozone ambient at a temperature of about 100 to 1000 degrees Centigrade.

14. The method of claim 7, wherein said removing of hydrogen comprises implanting a predetermined ion into said second dielectric film, wherein said implanting includes generating the predetermined ion from a source gas of at least one gas selected from the group consisting of $O_2$, $N_2$, $PH_3$, $BF_3$, $AsH_3$, and $BF_2$, supplying the source gas at a rate of about 1–100,000 sccm, imparting an energy of about 1–100 KeV to the predetermined ion of the source gas, and providing the second dielectric film with the predetermined ion in a dose of about $1.0 \times 10^{11}$ to $1.0 \times 10^{16}$ ions/cm$^2$.

15. The method of claim 7, wherein said removing of hydrogen comprises bombarding said second dielectric film with an electron beam, wherein the bombarding includes producing the ion beam from a gas selected from the group consisting of $O_2$ and $N_2$, supplying the gas at a rate of about 1–100,000 sccm, and irradiating the second dielectric layer with the electron beam at an energy of about 1–100 KeV, a temperature of about 100–2000 degrees Centigrade, and a pressure of about $1 \times 10^{-8}$ to $1 \times 10^{-3}$ Torr.

16. The method of claim 7, wherein eliminating said removing of hydrogen comprises:

(a) generating plasma from at least one gas selected from the group consisting of $O_2$, $N_2$, $H_2N_2$, and $NH_3$ and heat-treating said second dielectric layer with the plasma;

(b) baking said second dielectric layer with UV light; and (c) repeating the above steps (a) and (b) a plurality of times.

17. The method of claim 4, wherein said forming of a dielectric layer comprises forming the dielectric layer of a material having a Si—O—H structure.

18. The method of claim 5, wherein said forming of a dielectric layer comprises forming the dielectric layer of a material having a Si—O—H structure.

19. The method of claim 5, wherein said implanting comprises providing the dielectric layer with a dose of energized gas constituting a source of the ion, wherein the gas is at least one gas selected from the group consisting of $O_2$, $N_2$, $PH_3$, $BF_3$, $AsH_3$, and $BF_2$, the energy level effecting the implanting is within a range of about 1–100 KeV, and the dose is within a range of about $1.0 \times 10^{11}$ to $1.0 \times 10^{16}$ ions/cm$^2$.

20. The method of claim 6, wherein said forming of a dielectric layer comprises forming the dielectric layer of a material having a Si—O—H structure.

21. The method of claim 6, wherein said bombarding comprises producing the electron beam from one gas selected from the group consisting of $O_2$ and $N_2$, and providing the gas with an energy level of about 1 to 100 KeV.

22. The method of claim 7, wherein said etching comprises etching the dielectric layers with an etchant selected from the group consisting of $CHF_3$ and $CF_5$.

* * * * *